(12) United States Patent
Nurnus et al.

(10) Patent No.: US 9,874,584 B2
(45) Date of Patent: Jan. 23, 2018

(54) MONITORING ARRANGEMENT AND METHOD FOR MONITORING AN ELECTRICAL LINE

(75) Inventors: Joachim Nurnus, Neuenburg (DE); Fritz Volkert, Oberwil (CH); Martin Schmidt, Emmendingen (DE)

(73) Assignee: MICROPATENT B.V., Almelo (NL)

( * ) Notice: Subject to any disclaimer, the term of this patent is extended or adjusted under 35 U.S.C. 154(b) by 191 days.

(21) Appl. No.: 13/982,011

(22) PCT Filed: Jan. 27, 2012

(86) PCT No.: PCT/EP2012/051384
§ 371 (c)(1),
(2), (4) Date: Jul. 26, 2013

(87) PCT Pub. No.: WO2012/101271
PCT Pub. Date: Aug. 2, 2012

(65) Prior Publication Data
US 2014/0340074 A1    Nov. 20, 2014

(30) Foreign Application Priority Data

Jan. 28, 2011   (DE) .................. 10 2011 003 308

(51) Int. Cl.
*H01L 35/32*    (2006.01)
*G01R 1/07*    (2006.01)
(Continued)

(52) U.S. Cl.
CPC ............... *G01R 1/07* (2013.01); *B29C 51/06* (2013.01); *G01R 15/142* (2013.01);
(Continued)

(58) Field of Classification Search
CPC ............. G01R 19/0092; G01R 15/186; G01R 19/0084; G01R 21/00; H01L 35/30;
(Continued)

(56) References Cited

U.S. PATENT DOCUMENTS 3,236,708 A    2/1966  Tillis et al.
3,488,591 A    1/1970  Sonnenberg et al.
(Continued)

FOREIGN PATENT DOCUMENTS

DE    102 20 390 A1    12/2002
EP       1 684 080 A1    7/2006
EP          1684080    *    7/2006    ............. G01R 15/14

*Primary Examiner* — Alesa Allgood
(74) *Attorney, Agent, or Firm* — Maschoff Brennan (57) ABSTRACT

The invention relates to a monitoring arrangement for monitoring an electrical line having at least one thermogenerator and/or a device for inductively producing energy, determination means for determining at least one electrical characteristic parameter of an electrical current flowing in the electrical line and/or the temperature of the electrical line and/or the area surrounding the electrical line. An electrical connection exists or can be established between the determination means and the thermogenerator or the device for inductively producing energy, which connection can be used to operate the determination means with electrical energy produced by the thermogenerator or provided by the device for inductively producing energy; and connection means for establishing a mechanical connection to the electrical line.

17 Claims, 4 Drawing Sheets

(51) Int. Cl.
 *G01R 15/14* (2006.01)
 *H04Q 9/00* (2006.01)
 *B29C 51/06* (2006.01)
 *G01R 19/145* (2006.01)

(52) U.S. Cl.
 CPC ............ *G01R 19/145* (2013.01); *H04Q 9/00* (2013.01); *H04Q 2209/60* (2013.01); *H04Q 2209/84* (2013.01)

(58) Field of Classification Search
 CPC ... H01L 27/1255; H01L 35/32; H01L 27/124; H01L 29/78696; H01L 35/00
 See application file for complete search history.

(56) References Cited

U.S. PATENT DOCUMENTS

| | | |
|---|---|---|
| 5,892,430 A | 4/1999 | Wiesman et al. |
| 6,225,893 B1* | 5/2001 | Caissie .................. G08B 21/24 |
| | | 219/202 |
| 6,912,671 B2 | 6/2005 | Christensen et al. |
| 7,940,055 B2 | 5/2011 | Harres et al. |
| 2006/0244424 A1 | 11/2006 | Nelson |
| 2007/0235685 A1 | 10/2007 | Seki et al. |
| 2009/0008365 A1 | 1/2009 | Tong et al. |
| 2010/0091816 A1* | 4/2010 | Schroll .................... G01K 7/04 |
| | | 374/165 |
| 2010/0215358 A1 | 8/2010 | Harres et al. |

\* cited by examiner

MONITORING ARRANGEMENT AND METHOD FOR MONITORING AN ELECTRICAL LINE

CROSS-REFERENCE TO A RELATED APPLICATION

This application is a National Phase Patent Application of International Patent Application Number PCT/EP2012/051384, filed on Jan. 27, 2012, which claims priority of German Patent Application Number 10 2011 003 308.4, filed on Jan. 28, 2011.

BACKGROUND

The invention relates to a monitoring arrangement for monitoring an electrical line and a method for monitoring an electrical line.

It is known from the prior art to obtain snapshots of the temperature of the electrical current flowing in an electrical line, which is assigned for instance to a current distribution system by means of Infrared technique. However, when using this technique for instance a continuous monitoring of the current distribution system is not possible at or only possible to a limited extend.

SUMMARY

The object to be solved by the present invention is to provide a monitoring arrangement, which allows for a preferably efficient monitoring of a current distribution system. Furthermore, a corresponding method shall be provided.

According to an exemplary embodiment of the invention, a monitoring arrangement for monitoring an electrical line is provided with
- at least one thermogenerator and/or a device for inductively producing energy;
- determination means for determining at least one electrical characteristic parameter of an electrical current flowing in the electrical line and/or the temperature of the electrical line and/or the surrounding of the electrical line, wherein
- an electrical connection exists or can be established between the determination means and the thermogenerator or the device for inductively producing energy wherein via said connection the determination means can be operated with electrical energy generated by the thermogenerator or provided by the device for inductively producing energy; and
- connection means for establishing a mechanical connection to the electrical line.

Since the determination means can be fed with the electrical energy provided by the thermogenerator and/or the device for inductively producing energy, an at least essentially self-sufficient monitoring arrangement can be provided, whereby for instance less maintenance and servicing measures may be required, can be omitted at all or preventive measures can be reduced. For instance, the determination means are driven exclusively by the energy generated by the thermogenerator and/or the device for inductively producing energy.

The monitoring arrangement according to the invention can provide in particular a preferably continuous supervision (monitoring) of the current-carrying electrical line and/or a real time monitoring, in order to be able to recognize in time for instance critical situation (like an over-current). It is furthermore conceivable that by monitoring at least one electrical characteristic parameter of an electrical current carried in the line a control of a current distribution system, for instance of a production facility or plant or a building (like a shopping centre or an airport etc.) is provided, wherein the current distribution system is for instance a control cabinet and the electrical line to be monitored is a busbar. The monitoring arrangement according to the invention can, however, also be used for instance for monitoring a transmission line of a transmission line network.

The electrical connection between the determination means and the thermogenerator and/or the device for inductively energy producing is realised in particular by an electrical line (for instance a conducting path or a cable). The determination means comprise for instance an electrical connection or a circuit node, to which the electrical line is connected between the determination means and the thermogenerator and/or the device for inductively producing energy. It is, however, also possible that the electrical energy is transferred not via wire from the thermogenerator and/or the device for inductively producing energy for supplying the determination means, but wireless to the determination means (in particular via inductive coupling).

As already mentioned above the determination means can be operated exclusively with the electrical energy generated by the thermogenerator (or by multiple thermogenerators) and/or the device for inductively producing energy. It is, however, also conceivable that the monitoring arrangement comprises in addition to the at least one thermogenerator and/or the device for inductively producing energy at least one primary energy source (for instance a battery), which can be added to the thermogenerator or the device for inductively producing energy. It is, of course, also possible that in addition at least one secondary energy source (for instance a rechargeable battery) is provided which can be recharged for instance by the thermogenerator and/or the device for inductively producing energy, or a combination of at least one primary energy source and at least one secondary energy source.

The energy supply of the determination means occurs thus at least partially via the thermogenerator and/or via the device for inductively producing energy, wherein the thermogenerator generates energy due to a temperature gradient in the area of the electrical line and the device for inductively producing energy gains energy from an alternating magnetic field, which is present around the electrical line. The device for inductively producing energy comprises for instance an inductive sensor (comprising for instance at least one coil), which interacts with the magnetic field of the electrical line. The position of the coil of the inductively sensor relative to the line is in particular known, in order to conclude from the signal of the sensor to the current.

The thermogenerator still provides current for instance also after an interruption of the current flow in the line, since the line can still be warm within a certain time frame after switching of the current.

The connection means, via which the monitoring arrangement can be connected mechanically (in particular detachable) to the electrical line are designed in particular for obtaining a force and/or from locking connection to the electrical line. For instance, a clamping connection of the monitoring arrangement to the electrical line is obtainable with said connection means. In another variant, the connection means form a firmly bonded connection, in particular a glued connection between the monitoring arrangement and the electrical line.

It is furthermore conceivable that the connection means are designed such that they rest at least with a section against the electrical line after establishing the connection, wherein no electrical connection between the electrical line and the determination means is formed via the section resting against the electrical line. The connection means serve thus exclusively for establishing a mechanical connection and not for establishing an electrical connection to the electrical line.

The section of the connection means resting against the electrical line is for instance made of an electrically insulating material or it comprises an electrical insulating coating via which said section rests against the electrical line.

In an exemplary embodiment of the invention, the connection means comprise a resting area, which can be made to rest against the side of the electrical line facing away from the thermogenerator and/or the device for inductively producing energy. For instance, the connection means comprise an arm according to a type of a clamp, which can be moved relative to a carrier at which the thermogenerator and/or the device for inductively producing energy are arranged. The monitoring arrangement is then positioned on the electrical line such that the line passes between the carrier (which can be for instance also be covered by a housing part) and the arm, wherein by moving the arm the distance between the carrier and the arm can be adjusted to the diameter of the line. After positioning the monitoring arrangement at the line, the arm is moved towards the line until the resting area rests against the line, wherein for instance this position of the arm can be fixed via fixating means (for instance in form of a locking screw) or via snapping structures.

It is also possible that the arm is preloaded in respect to the carrier, wherein the arm is moved away from the carrier with the thermo element against the preloading for mounting the monitoring arrangement at the electrical line and the monitoring arrangement is arranged on the electrical line such that the line is located between the carrier and the arm. The arm will now rest against a side section of the electrical line facing away from the thermogenerator or the device for inductively producing energy due to the preloading thereof. The resting area is for instance formed via wire-like clamp of the connection means.

The clamp is for instance multifunctional and allows for instance a simple, fast and flexible assembly with one hand. The clamp fixates in particular the monitoring device on the electrical line such that besides a good mechanical hold (for instance no falling off during vibrations) a good thermal contact is also established.

Other modifications of the connection means are, of course, also conceivable; for instance the connection means can be designed additionally or alternatively to the described variance also for establishing a magnetic connection between the monitoring arrangement and the electrical line.

According to a further exemplary embodiment of the invention, the monitoring arrangement comprises transfer means for a wireless transfer of the recorded electrical parameter and/or an information regarding the recorded electrical parameter to a receiving device. The receiving device is for instance a receiving device designed specifically for communication with the transfer means of the monitoring arrangement. It is, however, also conceivable that the receiving device is a terminal device applicable also for other tasks, for instance a PC or a mobile telephone, and the transfer means sends information to this terminal device, for instance via text message (sms) or via the Internet.

The transfer means are operated for instance (in particular exclusively) with the energy generated by the thermogenerator and/or the device for inductively producing energy.

The monitoring arrangement can comprise furthermore an energy storage device for storing electrical energy, which is generated by the thermogenerator and/or the device for inductively producing energy. In particular, energy is stored in the energy storage device, which is not required by the determination means of the monitoring arrangement at the time of the generation thereof. The energy storage device allows in particular that the determination means can be supplied with sufficient energy also if the thermogenerator or the device for productively producing energy do not generate temporarily an amount of energy sufficient for the operation of the determination means. The energy storage device comprises for instance at least one capacitor (for instance in form of a "supercap") or a battery (for instance a thin film battery—TFB). An energy storage device can be omitted if the monitoring arrangement as mentioned above comprises in addition to the thermogenerator and/or the device for inductively producing energy a primary energy source. It is, however, also of course possible to provide an energy storage device as well as also a primary energy source.

According to a further exemplary embodiment of the invention, the energy storage device comprises first and second storage means, wherein the second storage means comprise a higher storage capacity than the first storage means. The first storage means can be part of an electronic circuit, which in particular serves to process the voltage generated by the thermogenerator and/or the device for inductively producing energy or provided by the second storage means.

The first storage means is for instance a capacitor connected to a DC-booster-circuit (up converter circuit). The voltage provided by said capacitor and the energy stored therein are in particular sufficient for allowing the start-up of the booster-circuit. The second storage means with the larger capacity do not serve then for operating the booster-circuit, but store additional energy, which is available for operating the remaining steps of the monitoring arrangement. This main energy storage device can be designed such that it stores excessive energy of the thermogenerator and/or the device for inductively producing energy completely or partially, which is not required at that time by the monitoring arrangement. It is pointed out that the energy storage device can comprise, of course, different elements, which are able to store electrical energy, for instance at least one capacitor and at least one battery.

Furthermore, the monitoring arrangement can comprise means, which control the utilisation of the energy generated by the thermogenerator and/or the device for inductively producing energy. These means determine for instance, which part of the generated energy is stored and which part is provided to the determination means or other components of the monitoring arrangement ("power management").

The monitoring arrangement can be designed besides the determination means for determining an electrical parameter of the current also for determining the temperature of the electrical line (and can comprise for this reason for instance a separate sensor). Such a temperature sensor can be in particular designed for generating an alarm signal, if the temperature of the electrical line exceeds a predetermined limit value. Furthermore, a plausibility check of the electrical parameter determined by the determination means is possible; for instance an increase of the temperature is also expected when the electrical current increases in the line. Furthermore, the surrounding of the electrical line can be, of course, monitored by the temperature sensor and can, for instance, trigger an alarm signal in case of a fire.

The temperature sensor is, for instance, to be arranged with a distance to the thermogenerator and/or the device for inductively producing energy, i.e. with a distance to a warm path, which passes from the electrical line through the thermogenerator and/or the device for inductively producing energy in order to keep an influence of the temperature measurement, for instance, by a cooling body of the monitoring device as low as possible. It is conceivable, for instance, that the temperature sensor determines the temperature inside of the electrical line by extrapolation of the temperature measured by the temperature sensor (for instance on the surface of the line and/or in the surroundings of the line).

Furthermore, the monitoring arrangement can also comprise means, which serve for evaluating the electrical parameter determined by the determination means and process the data provided for instance by the determination means such that a user (electricity consumer) can be provided with information about the amount of electricity used and other data regarding the electricity (for instance the corresponding electricity costs, i.e. a consumer information).

The determination means are in particular designed to detect (indirectly and/or directly) the current strength of the electrical current carried in the electrical line. Methods are known from the prior art for this purpose, which can be realised in the determination means; e.g. the determination means detect the current via a magnetic field of the electrical line and comprise for this reason in particular at least one Hall-sensor, at least one electro-resistive sensor and/or at least one inductive sensor. The determination means can be designed additionally or alternatively also to determine the voltage difference between two points of the electrical line, whereat for instance the current strength can be determined from said voltage difference. The determination means can also be designed by the device for inductively producing energy, i.e. the device for inductively producing energy forms a sensor, which is fed with energy of the magnetic alternating field of the line.

It is furthermore conceivable that the determination means can also determine an electrical voltage of the electrical line relative to a reference point being external to the electrical line (e.g. relative to the ground or relative to other electrical lines), e.g. via "magnetic field technology" of the supplier "Suparule".

In a further example of the invention, the determination means are also capable of detecting the phase between current and voltage in case of an alternating current carried in the electrical line. Furthermore, the determination means can comprise analysis tools, which process the detected electrical parameter; for instance determining a reactive current proportion from the detected phase and/or apply a Fourier transformation onto the parameter signal. Such an analysis of the parameter signal can, of course, also be carried out by an analysis tool not arranged on the electrical line, whereat for instance the determined parameter signal is transferred wireless by transfer means of the monitoring arrangement to said analysis tool.

Furthermore, the determination means can be designed to determine the electrical parameter in a time dependent manner, i.e. to determine the electrical parameter in particular in intervals, wherein the intervals between two subsequent measurements can be selected shortly (for instance one minute) such that a sufficient continuous determination of the electrical parameter occurs.

Furthermore, the determination means can be designed to determine deviations from selected signal form (i.e. the time course of at least one electrical parameter of the current carried in the line). The selected signal form is for instance a sinus pattern, wherein the determination means are capable to determine deviations from the expected sinus pattern in respect to frequency, amplitude and/or phase.

It is, of course, also possible that only the time course of the signal is detected (in particular with a sampling rate which is clearly higher than the frequency of the signal) without analysing the signal and only to store the signal and/or to communicate the signal. The detection of the signal can also occur in intervals and for a respective selected time (e.g. the signal is detected each minute for a second such that at a signal frequency of 50 Hz 50 cycles are detected, respectively).

Furthermore, the determination means can also be designed to determine deviations from a DC signal (direct current signal). The determination means are in particular designed to determine the frequency, the frequency spectra and/or an amplitude of the electrical parameter and/or as mentioned a reactive current proportion of the electrical current. The determination means are for instance designed to generate an alarm signal if the frequency, the amplitude and/or the reactive current proportion deviates from a reference value by a selected minimum value.

The signal form of the imprinted electrical voltage (and thus of the current flowing in the electrical line) is changed for instance by an error in a current distribution system or by a damage of the electrical line. The frequency of the voltage or the current and/or the amplitude change in particular such that a deviation of these parameters from a respective reference value can provide a hint to an error state and/or a threatening net instability. In case of a direct current, the presence of interfering frequencies in the frequency spectra can also indicate the presence of an error or a defect of the line. The cause of the error can be concluded in particular from an analysis of the time course of the electrical parameter.

According to another exemplary embodiment of the invention, the monitoring arrangement comprises switching means via which the determination means can be switched from a first energy saving status into a second active status. The determination means (or if present also the transfer means for wireless transfer of the detected parameter) can for instance "woken up" from a resting state via the switching means. "Energy saving" means that the determination means consume in the first status less electrical energy than in the second status, wherein the "first energy saving status" can be for instance also a off or stand-by status of the determination means. The switching means can furthermore also serve for switching the determination means from an active status into the energy saving status.

The monitoring arrangement can comprise furthermore also an internal storage device, which stores information (data) in respect to the detected electrical parameter. Said storage device allows in particular a storage of data in case that a connection of the monitoring arrangement to an external receiving unit (which otherwise exists for instance via a wireless connection) failed.

The monitoring arrangement can be designed furthermore to generate optical and/or acoustic signals, which signal an activity or another status information regarding the monitoring arrangement. The monitoring arrangement comprises for instance furthermore a display for displaying information (e.g. regarding the status of the monitoring arrangement and/or regarding the detected electrical parameter). The monitoring arrangement can comprise furthermore also means for generating an optical signal which serves for identifying the electrical line (for instance in case of a transmission line) or for facilitating locating the monitoring arrangement.

According to a further exemplary embodiment the monitoring arrangement comprises a housing made of an electrical insulating material, in which the at least one thermogenerator and/or the device for inductively producing energy and/or the determination means are arranged such that an electrical contact between the electrical line and said components of the monitoring arrangement is prevented.

In another example, the monitoring arrangement comprises a cooling body (heat sink) arranged on the cold side of the thermogenerator, wherein an insulating element extends on a side of the cooling body facing away from the thermogenerator, which shall prevent in particular an electrical contact of the cooling body to another current carrying element (for instance an adjacent electrical line).

The electrical insulation can also be realised by an electrically non-conducting cooling body.

Furthermore, the hot side of the thermogenerator can be in thermal contact to the electrical line via a heat distributor ("heat spreader") after assemblage of the monitoring arrangement. It is of course also conceivable that the cold side of the thermogenerator is brought into direct contact with the electrical line (e.g. without an intermediate element such as the heat distributor).

The surface of the heat distributor or the thermogenerator to be brought into contact with the electrical line can be designed such that said surface can be adapted to different surface contours. It is conceivable that the surface of the heat distributor consists at least sectionally of a flexible or elastic material. Furthermore, an adapting element could also be provided, which is arranged between the heat distributor and the electrical line, wherein the adapting element comprises a first surface, which is designed correspondingly to the surface of the heat distributor and a second surface, which is designed correspondingly to the surface of the electrical line.

The invention relates also to an arrangement comprising at least one electrical line and at least one monitoring arrangement arranged on the electrical line as described above.

The arrangement comprises for instance multiple of such monitoring arrangements, wherein each of the monitoring arrangements comprises transfer means for wireless transfer of the electrical parameter determined by the determination means and/or an information regarding the determined electrical parameter to a receiving device, and wherein the transfer means are designed to receive signals of the transfer means of the other monitoring arrangement and to transfer these signals to at least one other monitoring arrangement or to the receiving device. Herewith a redundancy of the transfer means is provided and simultaneously the range of the wireless transfer is increased.

The invention relates also to a method for monitoring an electrical line with the steps:
providing a monitoring arrangement, which is designed in particular according to one of the above described embodiments, wherein the monitoring arrangement comprises at least one thermogenerator and/or a device for inductively producing energy as well as determination means for determining at least one electrical parameter of an electrical current flowing in the electrical line and/or the temperature of the electrical line and/or the surrounding of the electrical line, wherein an electrical connection exists or can be established between the determination means and the thermogenerator, via which the determination means can be operated with electrical energy generated by the thermogenerator or provided by the device for inductively producing energy; and
establishing a mechanical connection between the monitoring arrangement and the electrical line.

It is in particular conceivable that the determination means operated by the electrical energy of the thermogenerator and/or the device for inductively producing energy are not designed for determining electrical parameters of the current carried in the line but only for determining the temperature of the line and/or the environment thereof. In this case, it is possible that additionally a measurement of electrical parameters of the current occurs via a conventional current sensor (which is not supplied with energy from the thermogenerator and/or the device for inductively producing energy). The determination means comprise in particular a temperature sensor designed as described previously in context with the monitoring arrangement.

Furthermore, it is possible that the temperature sensor is arranged in a distance to the electrical line. The determination means can comprise additionally or alternatively a temperature sensor, which is positioned close to the line or is arranged such that said sensor rests against the electrical line for determining the temperature.

BRIEF DESCRIPTION OF THE DRAWINGS

The invention is explained in more detail in the following by means of embodiments with reference to the figures.

FIG. 7A, 7B show top views of a monitoring arrangement according to a further embodiment of the invention.

DETAILED DESCRIPTION

Figure 1:
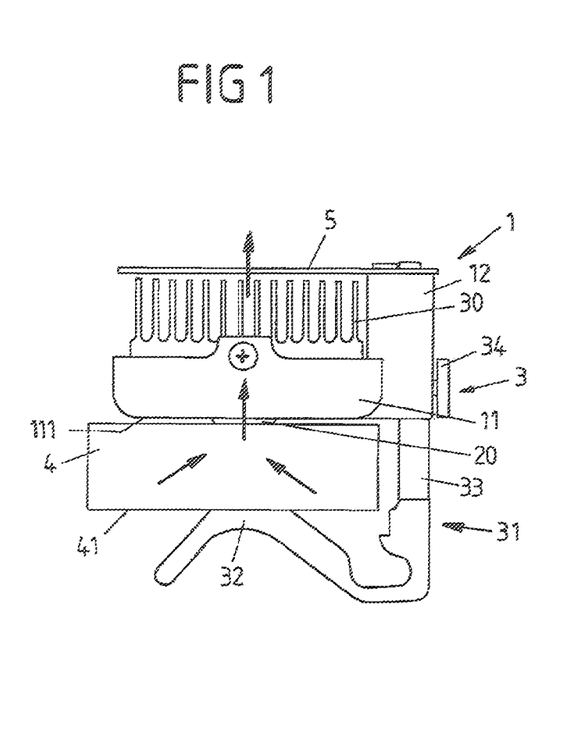
FIG. 1 shows a top view of a monitoring arrangement according to an embodiment of the invention arranged on a busbar.

The monitoring arrangement 1 according to the invention illustrated in FIG. 1 comprises two thermogenerators arranged in an electrically insulated housing part 11 (covered by the housing part 11), the hot sides thereof are in each case in thermal contact to a heat distributor ("heat spreader") 20 projecting from the housing part 11. The cold sides of the thermogenerator are coupled thermally to a heat sink in form of a ripped radiator 30.

The monitoring arrangement 1 comprises furthermore connection means 3 via which the monitoring arrangement is mounted on an electrical line in form of a busbar 4, wherein FIG. 1 shows the busbar 4 in cross-sectional view. The connection means 3 comprise an arm 31 which is movable vertical to the main extension direction of the busbar 4 (and accordingly also vertical to a bottom section 111 of the housing part 11 facing the busbar). The arm 31 comprises a section 33 which extends essentially along the moving direction (i.e. vertical to the bottom section 111 of the housing part 11) and which is movably stored in a further housing part 12 being adjacent sideways to the housing part 11. The section 33 is guided movably in particular according to the type of a rail in a channel of the housing part 12. The housing parts 11 and 12 are for instance connected to each other in one piece.

The arm comprises furthermore a curved resting area 32 wherein the distance between the bottom area 111 (and the heat distributor 20) and the resting area 32 can be changed by moving the arm and can be adjusted to the diameter of the busbar, i.e. to the height of the busbar having a rectangular cross section. After arranging the monitoring arrangement on the busbar such that said busbar is located between the bottom section 111 of the housing part 11 and the resting area 32 of the arm 31, the arm is moved on the busbar until the resting area 32 comes to rest against a side 41 of the busbar 4 facing away from the bottom section 111 (and thus also the heat distributor 20). The arm 31 can be fixed in this position by means of a fixing screw 34 such that the arm 31 prevents a tipping of the monitoring arrangement from the busbar.

The screw 34 is inserted in one of multiple through holes present in the arm section 33 (FIG. 2) and is tight up for fixating the arm. The through holes comprise in each case for instance a distance to each other of 5 mm such that the monitoring arrangement can be arranged on busbar with heights of 5, 10, 15 and 20 mm. These values are of course only exemplarily and the monitoring arrangement can also be adapted to other busbar geometries (for instance also continuously). The arm 31 can be designed in particular also for an arrangement on busbar or other electrical lines, which do not comprise in rectangular cross section.

Furthermore, by resting the resting area 32 of the arm 31 a clamping between the monitoring arrangement and the busbar 4 can be established, wherein due to the friction force between the resting area 32 and the busbar 4 a movement of the monitoring arrangement along the busbar is counter acted.

Figure 2:
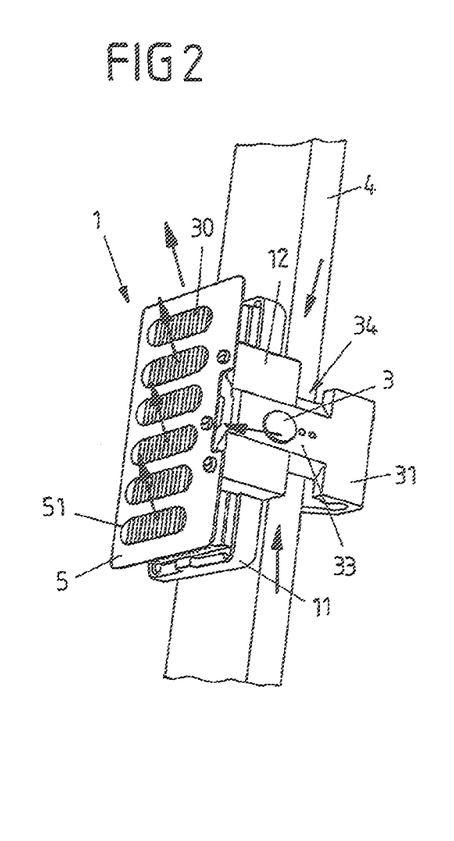
FIG. 2 shows the monitoring arrangement of FIG. 1 in a perspective view.
Figure 2A:
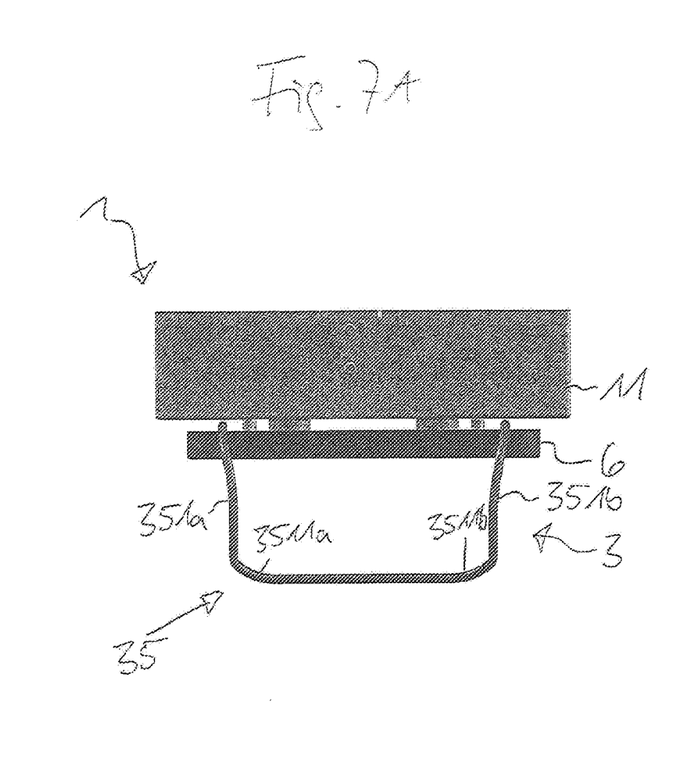
Figure 2B:
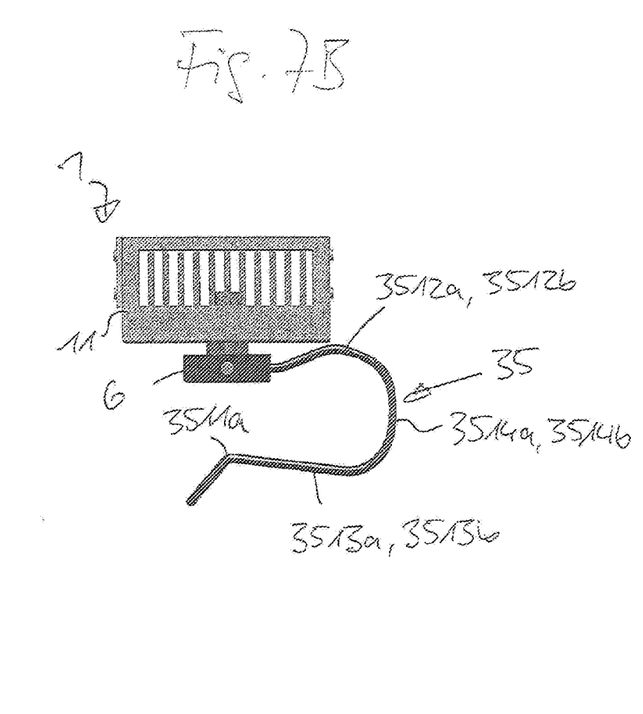
Figure 3:
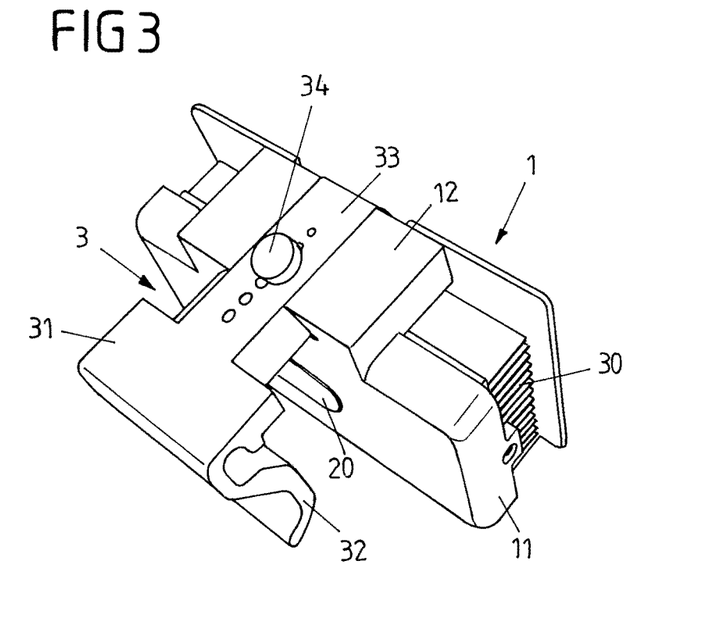
FIG. 3 shows another perspective view of the monitoring arrangement of FIGS. 1 and 2.

The embodiment of the connection means 3 shown in FIGS. 1, 2, 3 is of course only exemplarily. Diverse variances are conceivable in order to realise a connection of the monitoring arrangement to the busbar; for instance, the resting area 32 of the arm does not have to continue in a curved manner. Furthermore, an arm 31 could also be provided which is preloaded in respect to the housing part 11 such that a fixation of the monitoring arrangement is thus achieved since the resting area 32 of the arm presses against the lower side 41 of the busbar 4 due to the preloading after arranging the monitoring arrangement on the busbar.

Determination means in form of a current sensor are also arranged in the housing part 11 besides both thermogenerators, which are designed for measuring electrical parameters (for instance current and/or voltage) of a electrical current carried in the busbar 4. The determination means can be arranged for instance together with the thermogenerators on a circuit board (compare FIG. 4).

Due to the current transport through the busbar 4 an increased temperature of the busbar relative to its surrounding results such that a temperature gradient between the busbar 4 and the cooling body 30 results under the influence thereof the two thermogenerators generate a thermo-voltage which is used for operating the determination means. The heat flow originating from the busbar 4 through the thermogenerators is indicated by arrows in the FIGS. 1 and 2.

The housing part 11, 12 as well as the arm 31 are made of an electrically non-conducting (or only badly conducting) material (in particular made of plastic). Furthermore, the monitoring arrangement 1 comprises on a side of the cooling 30 facing away from the housing part 11 an insulating disc like cover 5 (which is also made of an insulating plastic or composite as for instance FR4), which serves in particular to prevent a contact of the cooling body 30 (made in particular of a metal) such as aluminium) to other objects supplied with voltage (for instance in an adjacent busbar). The cover plate 5 is designed almost rectangular in a top view and is connected to the further housing part 12 on a longitudinal side.

As deducible in particular from FIG. 2, cover 5 comprises a plurality of recesses 51 in order to guarantee a preferably good heat transport from the cooling body 30.

Figure 4:
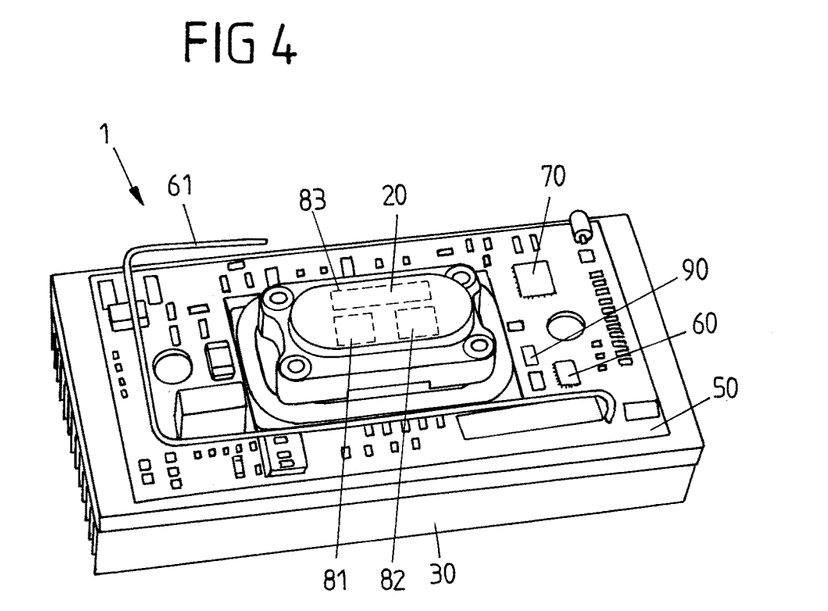
FIG. 4 shows a monitoring arrangement of FIGS. 1, 2, 3 with the housing removed.

FIG. 4 shows the monitoring arrangement of the FIGS. 1 to 3 without the housing parts 11, 12 and the connecting means 3. The thermogenerators 81, 82 and/or a device for inductively producing energy 83 are located beneath the heat distributor 20 on a board 50. The board 50 is connected to the cooling body 30, for instance by a glue, with its side facing away from the heat distributor 20. The current sensor (not illustrated) is also arranged on the circuit board 50.

Transfer means for wireless transfer of information regarding electrical parameter determined by the determination means 90 to an external receiving device are furthermore located on the circuit board. These transfer means comprise an electronic component 60 as well as antenna 61 being connected to said component.

Further electronic components, for instance a microcontroller 70 for controlling the monitoring arrangement as well as components for processing the electrical voltage generated by the thermogenerators 81,82 and/or for analysing the parameters determined by the determination means 90 as well as the storage component for storing electrical energy of the thermogenerators, 81, 82 are located on the board 50.

Figure 5:
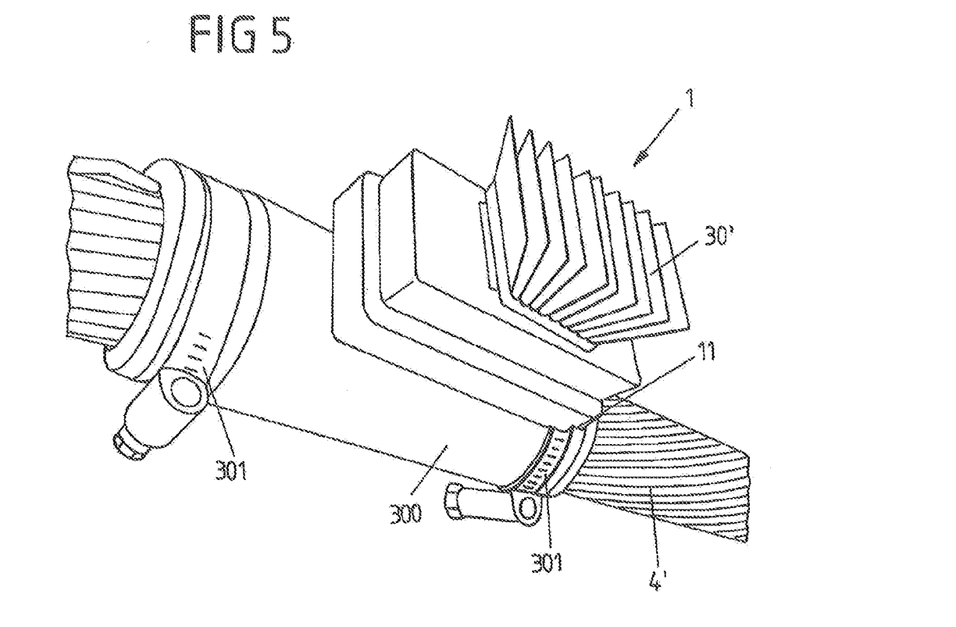
FIG. 5 shows a monitoring arrangement according to a further embodiment of the invention arranged on an electrical line.

FIG. 5 shows a further embodiment of a monitoring arrangement 1. In contrast to the embodiment according to the FIGS. 1 to 4, the connecting means for connecting the monitoring arrangement to an electrical line are not designed in form of a clamp. Rather, the housing part 11, which encloses a circuit board with the thermogenerators as in FIGS. 1 to 3, is connected to a collar 300. The collar 300 can be placed around an electrical line (or as shown in FIG. 5 also around a bundle 4' of multiple electrical lines) and can be mounted to the line by means of brackets 301.

In contrast to the embodiment of FIGS. 1 to 3, the cooling body 30' is designed furthermore fan-like.

Figure 6:
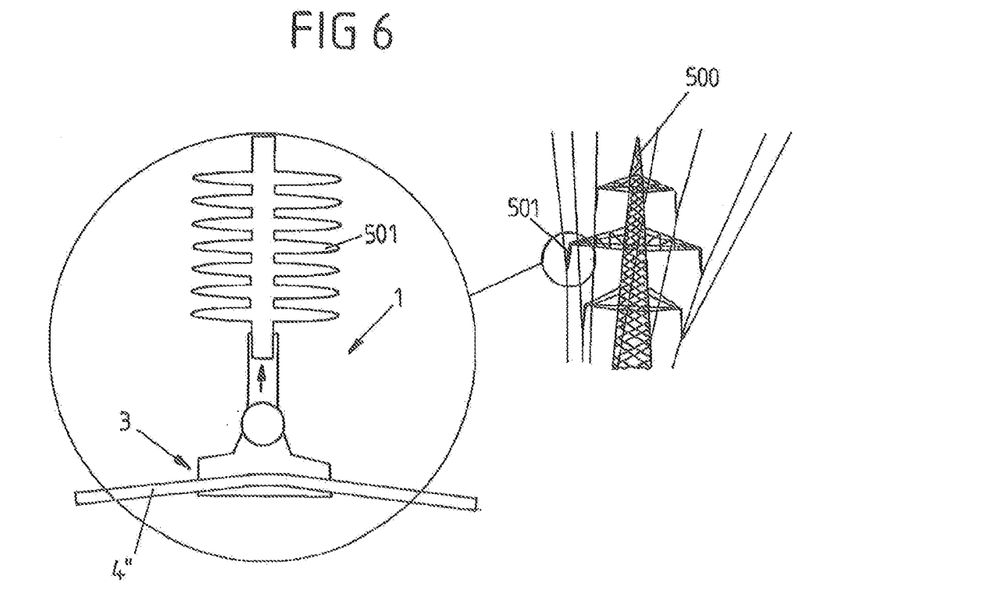
FIG. 6 shows schematically a monitoring arrangement according to the invention arranged on a transmission line.

FIG. 6 shows schematically a further possibility of the embodiment of the monitoring arrangement according to the invention, wherein the monitoring arrangement is arranged on an electrical line in form of power lines 4".

Accordingly, the monitoring arrangement 1 comprises connecting means 3 via which it can be connected to the current carrying line 4". Furthermore, the monitoring arrangement 1 comprises further connecting means, which allow a connection of the monitoring arrangement to an insulator 501, via which an electrical line 4" hangs on an arm of a power pole 500.

Furthermore, the determination means of the monitoring arrangement 1 are designed in form of an ammeter via which a current can be measured flowing from the electrical line 4" via the insulator 501 and thus the current strength of the current flowing in the electrical line 4" can be determined.

FIGS. 7A and 7B relate to a further embodiment of the invention. The monitoring arrangement 1 comprises here similar to FIGS. 1 to 4 a thermogenerator arranged in a housing part 11 and/or a device for inductively producing energy arranged therein, which in each case serve for supplying determination means accommodated at least partially also in the housing 11 (see above). Instead of a movable arm, the connecting means 3 of the monitoring arrangement comprise, however, a clamp 35, which is formed by a wire-like element (or multiple wire-like elements).

The clamp 35 comprises two outer sub-sections 351a, 351b which are in top view (if looked at along the electrical line) are in each case at least approximately U-shaped, which comprise in each case a lower resting section 3511a, 3511b, which will rest against the electrical line (not shown) after assembly. In order to assembly the monitoring arrangement 1 on the electrical line, the clamp 35 is bend open according to the diameter of the electrical line and is moved onto the line such that it is preloaded against the line and a clamping connection is realised between the clamp and line.

The clamp is designed for instance such that it bends open by itself when moving onto the line in a predetermined diameter area of the line—i.e. adapts to the line.

The sideways sub-section 351a, 351b obtain their U-shape since they comprise in each case an upper arm section 3512a, 3512b, which is mounted on a carrier 6 connected to the housing part 11 as well as the lower arm section 3513a, 3513b, which is connected to the upper arm section 3512a, 3512b via a curvature 3514a, 3514b. The clamp 35 allows for instance a one-handed assemblage and can be adapted in a simple manner to different line cross-sections, for instance said clamp can be constructed such that it can be clamped to lines with a diameter between 5 and 20 mm.

It is possible that the clamp 35 is made of an electrically insulating material or comprises an electrically insulating coating or an insulating cover (and for instance a metallic core, for instance a metallic wire).

It is to be pointed out that in all embodiments a device for inductively producing energy can be used instead of a thermogenerator or in addition to the thermogenerator.

The invention claimed is:

1. A monitoring arrangement for monitoring an electrical line comprising: at least one thermogenerator; determination means for determining at least one electrical characteristic parameter of an electrical current flowing in the electrical line and/or a temperature of the electrical line and/or the surrounding of the electrical line, wherein an electrical connection established between the determination means and the thermogenerator, wherein via said connection the determination means is configured to be operated with electrical energy generated by the thermogenerator; and connection means for establishing a mechanical connection to the electrical line, wherein the connection means comprise a resting area which is made of an electrical insulating material or comprises an electrical insulating coating and which is configured to rest against a first side of the electrical line while the thermogenerator as well as the determination means are arranged on a second side of the electrical line opposite the first side.

2. The monitoring arrangement according to claim 1, wherein the connection means are designed for establishing a force locking, form locking and/or firmly bonded connection to the electrical line.

3. The monitoring arrangement according to claim 1, wherein the resting area is formed by a wire-like clamp of the connection means.

4. The monitoring arrangement according to claim 1, wherein the connection means are formed for establishing a magnetic connection to the electrical line.

5. The monitoring arrangement according to claim 1, further comprising transfer means for wireless transfer of a recorded parameter and/or information regarding the at least one electrical characteristic parameter to a receiving device.

6. The monitoring arrangement according to claim 1, wherein the determination means are designed to determine the electrical parameter time-dependent and to identify deviations from a defined signal form.

7. The monitoring arrangement according to claim 1, further comprising switching means via which the determination means can be switched from a first energy saving status in a second active status.

8. The monitoring arrangement according to claim 1, further comprising a transfer means for wireless transfer of the determined at least one electrical characteristic parameter and/or an information relating to a recorded parameter to a receiving device, and wherein the transfer means are designed to receive signals of the transfer means of a second monitoring arrangement and to transfer these signals to the second monitoring arrangement or to the receiving device.

9. The monitoring arrangement according to claim 1, wherein the resting area is formed by an arm of the connection means, which is movable vertical to the electrical line.

10. The monitoring arrangement according to claim 9, wherein the resting area is formed by a curved area of the arm.

11. The monitoring arrangement according to claim 1, further comprising an energy storage device for storing electrical energy, which is generated by the thermogenerator.

12. The monitoring arrangement according to claim 11, wherein the energy storage device comprises first and second storage means, wherein the second storage means comprise a higher storage capacity than the first storage means.

13. The monitoring arrangement according to claim 11, wherein the determination means are designed to generate an alarm signal if the temperature, frequency, the amplitude and/or a reactive current portion deviates from a reference value by a defined minimal value.

14. The monitoring arrangement according to claim 1, wherein the determination means are designed to determine the current, an electrical voltage along the electrical line and/or a reference point being external in respect to the electrical line and/or a phase between current and voltage.

15. The monitoring arrangement according to claim 14, wherein the determination means are designed to determine a frequency, a frequency spectrum and/or an amplitude of the at least one electrical characteristic parameter and/or a reactive current portion of the electrical current led in the electrical line.

16. The monitoring arrangement according to claim 15, wherein the determination means are designed to generate an alarm signal if the temperature, frequency, the amplitude and/or the reactive current portion deviates from a reference value by a defined minimal value.

17. A method for monitoring an electrical line, the method comprising: providing a monitoring arrangement that comprises at least one thermogenerator as well as determination means for determining at least one electrical parameter of a electrical current flowing in the electrical line and/or a temperature of the electrical line and/or a surrounding of the electrical line, wherein an electrical connection is established between the determination means and the thermogenerator, via which the determination means is configured to be operated with electrical energy generated by the thermogenerator; and establishing a mechanical connection between the monitoring arrangement and the electrical line with connection means, wherein the connection means comprise a resting area which is made of an electrical insulating material or comprises an electrical insulating coating and which is configured to rest against a first side of the electrical line while the thermogenerator as well as the determination means are arranged on a second side of the electrical line opposite the first side.

* * * * *